United States Patent [19]

Ho et al.

[11] Patent Number: 5,364,804
[45] Date of Patent: Nov. 15, 1994

[54] NITRIDE CAP SIDEWALL OXIDE PROTECTION FROM BOE ETCH

[75] Inventors: Yen-Shyh Ho, Fan-lu, Chayi; Chien-Yung Chen, Hsin-chu, both of Taiwan, Prov. of China

[73] Assignee: Taiwan Semiconductor Manufacturing Company, Hsinchu, Taiwan, Prov. of China

[21] Appl. No.: 145,160

[22] Filed: Nov. 3, 1993

[51] Int. Cl.$^5$ .................. H01L 21/335; H01L 21/318
[52] U.S. Cl. ........................................ 437/41; 437/24; 437/44; 437/195; 437/241; 437/978; 437/984
[58] Field of Search ................... 437/40, 41, 44, 195, 437/978, 984, 52, 24, 241

[56] References Cited

U.S. PATENT DOCUMENTS

| | | | |
|---|---|---|---|
| 4,420,872 | 12/1983 | Solo de Zaldivar | 437/24 |
| 4,808,548 | 2/1989 | Thomas et al. | 437/57 |
| 4,855,247 | 8/1989 | Ma et al. | 437/44 |
| 5,053,351 | 10/1991 | Fazan et al. | 437/52 |
| 5,240,872 | 8/1993 | Motonami et al. | 437/52 |
| 5,270,240 | 12/1993 | Lee | 437/52 |
| 5,286,667 | 2/1994 | Lin et al. | 437/52 |

*Primary Examiner*—T. N. Quach
*Attorney, Agent, or Firm*—George O. Saile

[57] ABSTRACT

A method of forming a self-aligned contact is disclosed. A pattern of polysilicon gate electrode stack including a silicon oxide gate dielectric, a polysilicon gate electrode, a first thermal polyoxide layer over the top of said polysilicon gate electrode layer, a first silicon nitride layer over said first thermal polyoxide layer, and a TEOS layer over said silicon nitride layer is provided on a silicon substrate. Each of the layers has its sides open to the ambient. Inert ions are implanted into the substrate which is not covered by the polysilicon gate electrode stack in such a manner as to reduce the possibility of the oxidation of the surface of the substrate. The pattern of polysilicon gate electrode stack and the surface of the said substrate are subjected to a thermal oxidizing ambient which causes oxidation of the sides open to the ambient of the polysilicon layer to form a second polyoxide layer on the sides of the polysilicon layer. A second silicon nitride layer is formed over the pattern of stack and the surface of the substrate. The second silicon nitride layer is anisotropically etched to remove the second silicon nitride from the top of the stack and from over the surface of the substrate while leaving the second silicon nitride layer remaining upon the sides of the stack to form a self-aligned opening to regions within the silicon substrate. A self-aligning contact to the regions is formed through said opening.

12 Claims, 5 Drawing Sheets

NITRIDE CAP SIDEWALL OXIDE PROTECTION FROM BOE ETCH

BACKGROUND OF THE INVENTION (1) Field of the Invention

The invention relates to a method of forming contacts in an integrated circuit device, and more particularly, to a method of forming contacts in which sidewall oxide is protected from etch damage by a nitride cap.

(2) Description of the Prior Art

In forming self-aligning contacts, the major problem area is in the contact wet etch step. Referring to FIG. 1, there is shown an enlarged view of a portion of a partially completed integrated circuit. A gate oxide layer 14 has been grown on the surface of silicon substrate 10. A polysilicon gate 16 is shown with polyoxide sidewall and overlying layer 18 which has been formed by oxidation of the polysilicon. A silicon nitride layer 20 overlies the polyoxide layer 18. A layer of tetraethoxysilane (TEOS) 22 has been deposited over the silicon nitride. Layer 23 is a photoresist layer. First a dry etch is performed to etch into the TEOS layer, which is about 3000 Angstroms in thickness, to leave about 700 Angstroms of the TEOS layer Next, a wet etch is performed to remove the remaining TEOS. This is typically a buffered oxide etch (BOE) of 10:1 water to hydrofluoric acid. One problem that occurs with the wet etch is illustrated by 1 in FIG. 1. The photoresist is undercut into the TEOS layer. This is not a major problem. Problem area 2 is a nitride overhang caused by the isotropic etching of the polyoxide 18 under the nitride layer 20. A third problem is a stack coverage problem caused by the nonvertical polyoxide sidewall. When metal is deposited into the contact, a void may be formed because of the birds-beak formation at 3 and the metal layer will be thinner than desired because of the undercut at 2. U.S. Pat. No. 5,053,351 to Fazan et al describes a process for forming a contact opening which uses a sidewall silicon nitride cap. That process uses a single silicon nitride layer and uses a photoresist layer in forming the contact so it is not a true self-aligned contact.

SUMMARY OF THE INVENTION

A principal object of the present invention is to provide an effective and very manufacturable method of forming a self-aligned contact in the fabrication of an integrated circuit.

Another object of the present invention is to provide a method of eliminating sidewall overhang in contact formation.

Yet another object of the present invention is to provide a method of reducing the sidewall birds-beak in contact formation.

Yet another object is to improve metal step coverage within the contact opening.

In accordance with the objects of this invention a new method of forming a self-aligned contact is achieved. A pattern of polysilicon gate electrode stack including a silicon oxide gate dielectric, a polysilicon gate electrode, a first thermal polyoxide layer over the top of said polysilicon gate electrode layer, a first silicon nitride layer over said first thermal polyoxide layer, and a TEOS layer over said silicon nitride layer is provided on a silicon substrate. Each of the layers has its sides open to the ambient. Inert ions are implanted into the substrate which is not covered by the polysilicon gate electrode stack in such a manner as to reduce the possibility of the oxidation of the surface of the substrate. The pattern of polysilicon gate electrode stack and the surface of the said substrate are subjected to a thermal oxidizing ambient which causes oxidation of the sides open to the ambient of the polysilicon layer to form a second polyoxide layer on the sides of the polysilicon layer. A second silicon nitride layer is formed over the pattern of stack and the surface of the substrate. The second silicon nitride layer is anisotropically etched to remove the second silicon nitride from the top of the stack and from over the surface of the substrate while leaving the second silicon nitride layer remaining upon the sides of the stack to form a self-aligned opening to regions within the silicon substrate, A self- O aligning contact to the regions is formed through said opening.

BRIEF DESCRIPTION OF THE DRAWINGS

In the accompanying drawings forming a material part of this description, there is shown.

DESCRIPTION OF THE PREFERRED EMBODIMENTS

FIGS. 2 through 10 illustrate a CMOSFET integrated circuit in which both N channel and P channel devices are formed on the same substrate. However, it is well understood by those skilled in the art that either an N channel or a P channel MOSFET device could be formed by using only one of the channels illustrated for the CMOSFET device.

Figure 2:
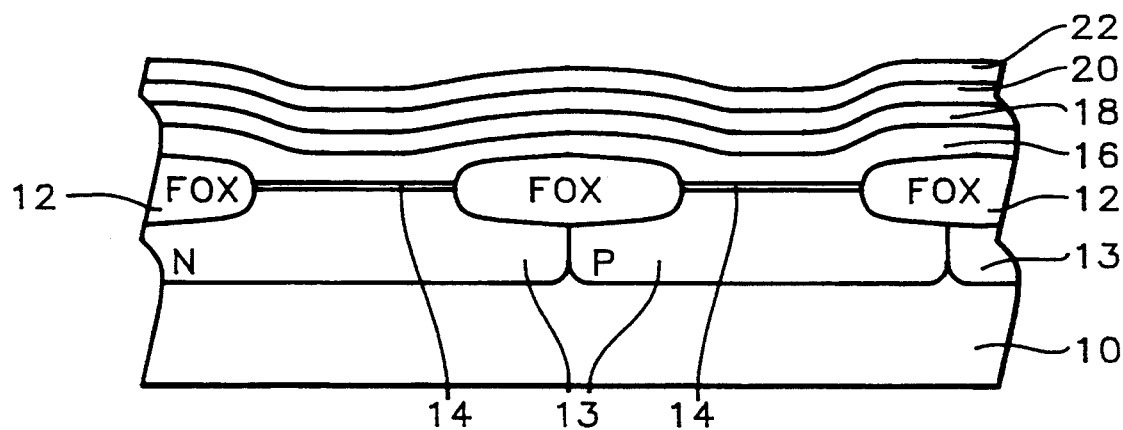
FIGS. 2 through 10 schematically illustrate in cross-sectional representation one preferred embodiment of the present invention.

Referring now more particularly to FIG. 2, there is shown a portion of a partially completed integrated circuit. The semiconductor substrate 10 is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 12. Then semiconductor devices can be provided in the silicon mesas according to the following processes.

In this CMOSFET example, n- and p-tubs 13 are formed within the substrate, according to a twin-tub process such as that described in *VLSI Technology*, International Edition, by S. M. Sze, McGraw-Hill Book CO., Inc., NY, NY, c. 1988, 1983 by Bell Telephone Laboratories, Inc.,pp. 484–487, The surface of the silicon substrate 10 is thermally oxidized to form the desired gate dielectric silicon oxide 14 thickness. The preferred thickness is between about 330 to 370 Angstroms. The polysilicon layer 16 is blanket deposited by low pressure chemical vapor deposition (LPCVD). The preferred thickness of the polysilicon layer 16 is between about 2950 to 3350 Angstroms. The polysilicon layer 16 is preferably doped in a nitrogen rich $POCl_3$ ambient at about 950° C. The polysilicon is oxidized to form a layer 18 of polyoxide with a thickness of between about 150 to 250 Angstroms. A layer of silicon nitride ($Si_3N_4$) 20 is deposited over the polyoxide layer 18 to a thickness of between about 550 to 650 Angstroms. At this point the process of the invention departs from the conventional self-aligned contact process. A layer of tetraethoxysilane (TEOS) 22 is deposited over the silicon nitride layer 20 to a thickness of between about 300 to 500 Angstroms. This TEOS layer will prevent later loss of the silicon nitride layer 20.

Figure 3:
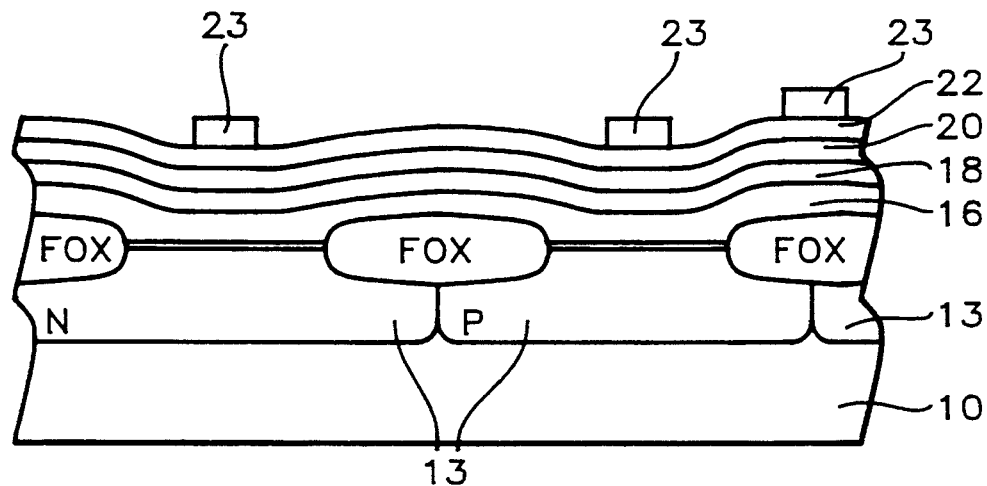
Figure 4:
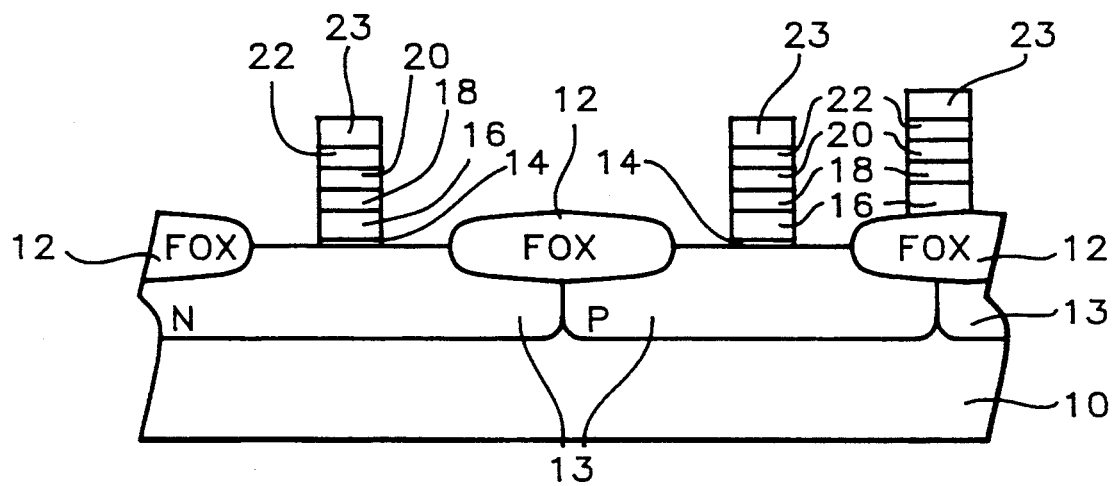

Referring now to FIG. 3, photoresist layer 23 is deposited and patterned to mask those regions where the polysilicon gate electrode stack will be formed. The layers 14, 16, 18, 20, and 22 are patterned using a dry etcher to provide a desired pattern of gate electrode stacks and gate dielectric on the surfaces of substrate 10, the FOX 12 surfaces or elsewhere as seen in FIG. 4.

Figure 5:
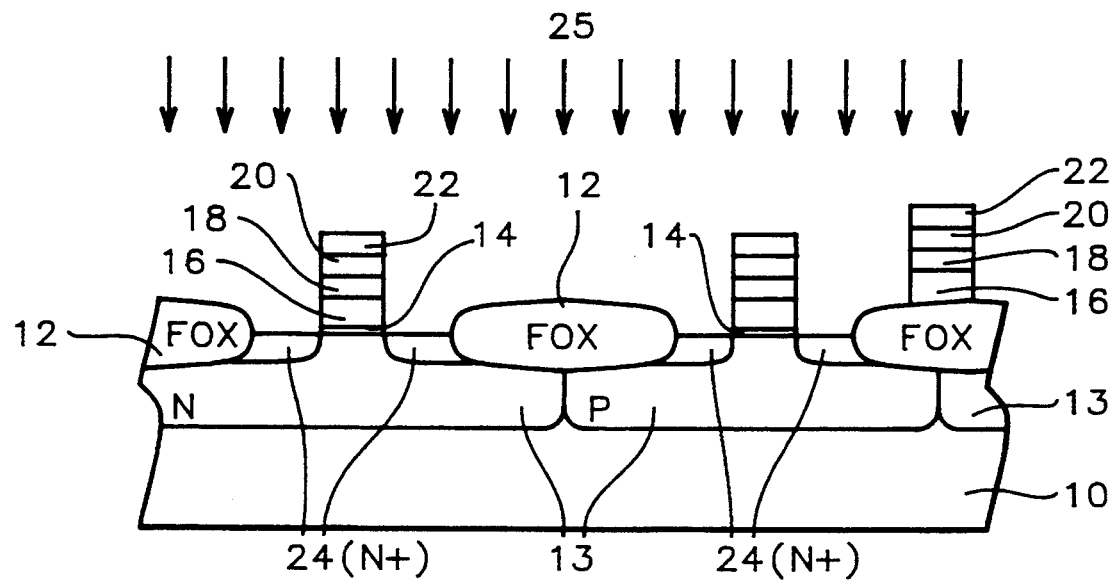
Figure 6:
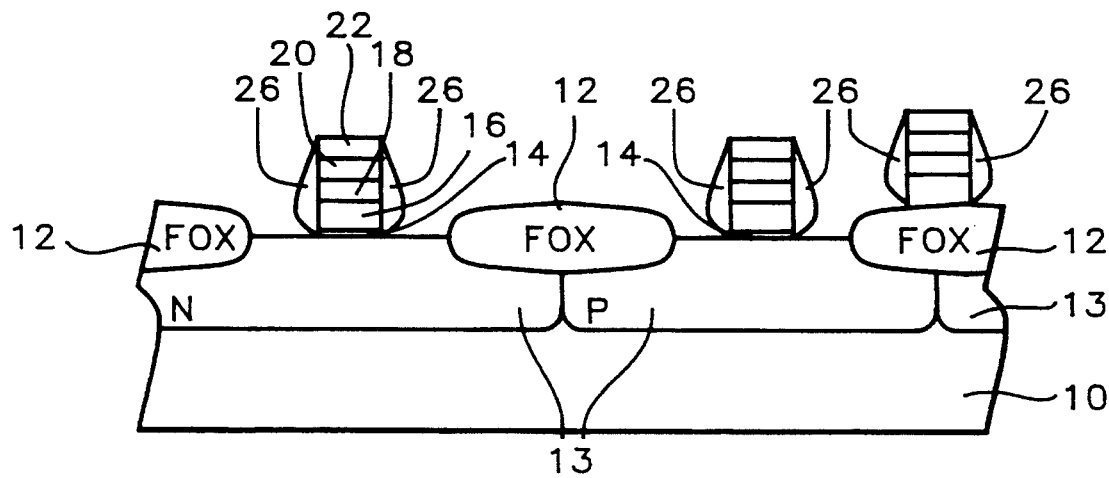

Referring now to FIG. 5, inert ions such as $N_2$ ions are implanted into the substrate so as to reduce the possibility of oxidation of the substrate surface. The ion implantation 25 is done with a dosage of between about 3 E 15 to 4 E 15 atoms/$cm^2$ and energy of between about 50 to 60 KeV. implanted regions 24 are formed within the substrate.

The pattern of gate electrode stacks and the surface of the substrate are now subjected to a thermal oxidizing ambient at a temperature of between about 900 to 1000° C. for a duration of between about 4 to 6 hours. This results in a sidewall oxidation 26 with a thickness of between about 1850 to 2350 Angstroms, shown in FIG. 6.

Figure 1:
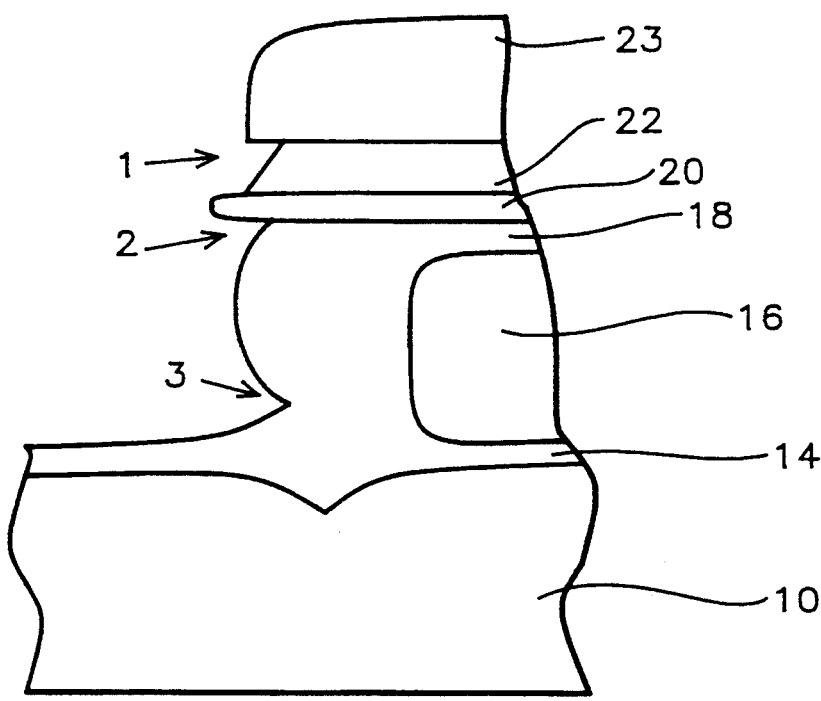
FIG. 1 schematically illustrates in cross-sectional representation drawbacks of the conventional self-aligned contact process.
Figure 7:
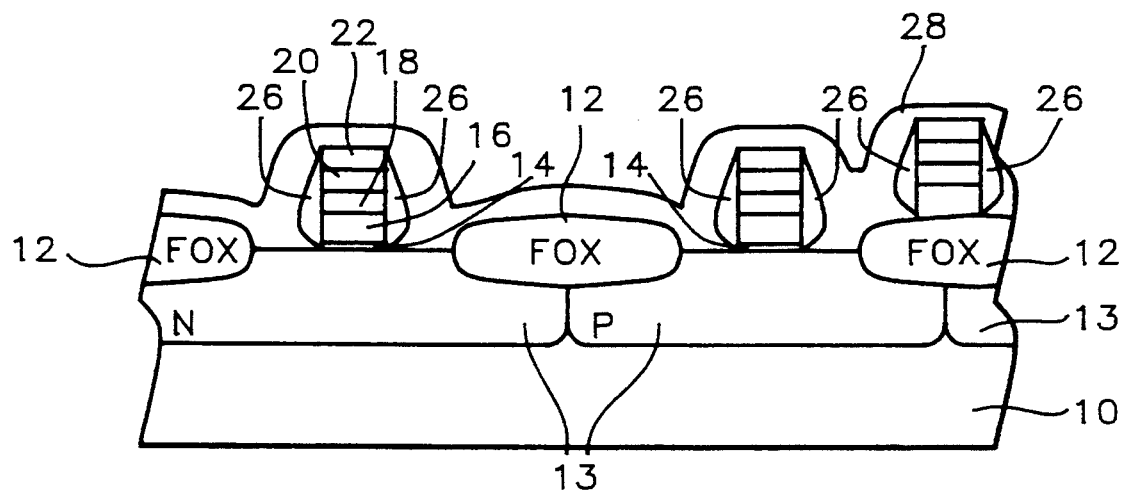
Figure 8:
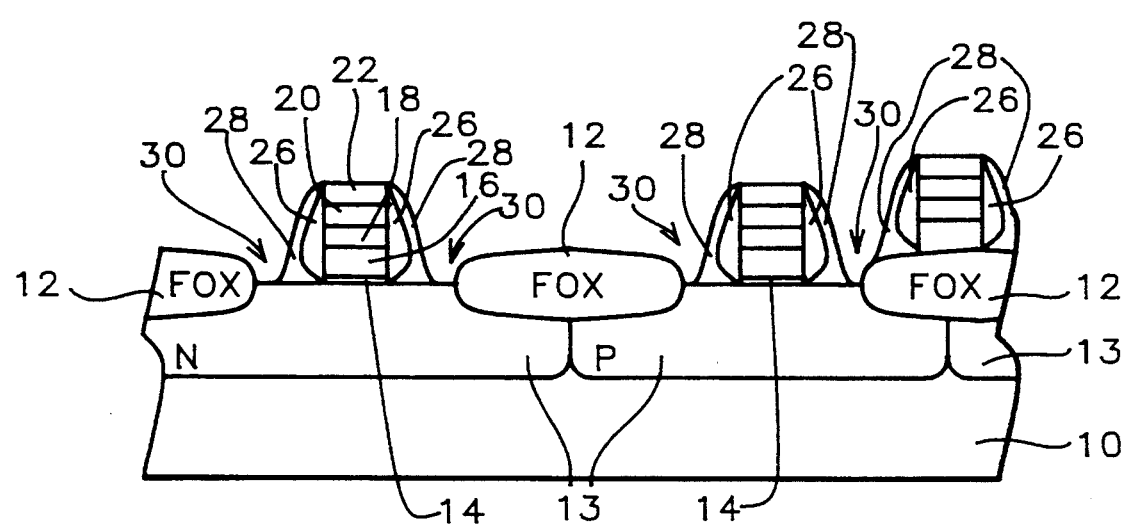

A second silicon nitride layer 28 is deposited over the pattern of gate electrode stacks and the surfaces of the substrate, as illustrated in FIG. 7. This layer 28 is deposited by LPCVD to a thickness of between about 550 to 650 Angstroms. The silicon nitride layer 28 is anisotropically etched back using a reactive ion etch to leave a nitride cap on the sidewalls of each gate electrode stack forming self-aligned openings 30 to regions within the silicon substrate as shown in FIG. 8. No photoresist is required for this silicon nitride etchback. There is no undercutting such as is illustrated by 3 in FIG. 1 because the site of the undercutting will be filled by reacted silicon nitride film.

Figure 9:
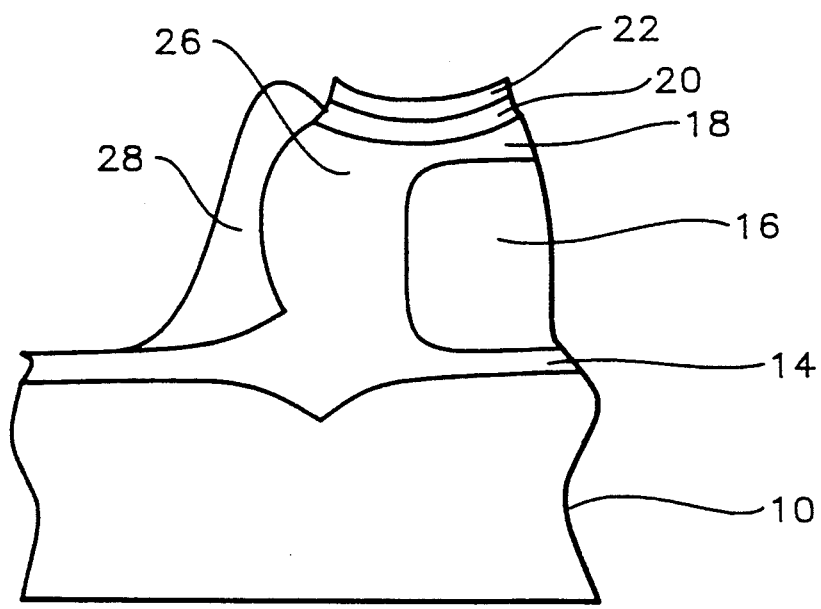

The second silicon nitride layer 28 produces a better, more vertical sidewall than the silicon oxide layer 26 for improved metal step coverage. Referring now to FIG. 9, there is shown an enlarged view of the silicon nitride cap 28 on the gate electrode stack. It can be seen that the silicon oxide sidewall 26 would not provide a vertical surface; but that the silicon nitride sidewall 28 does provide a more vertical surface allowing better stack coverage in the subsequent metal sputtering step.

Figure 10:
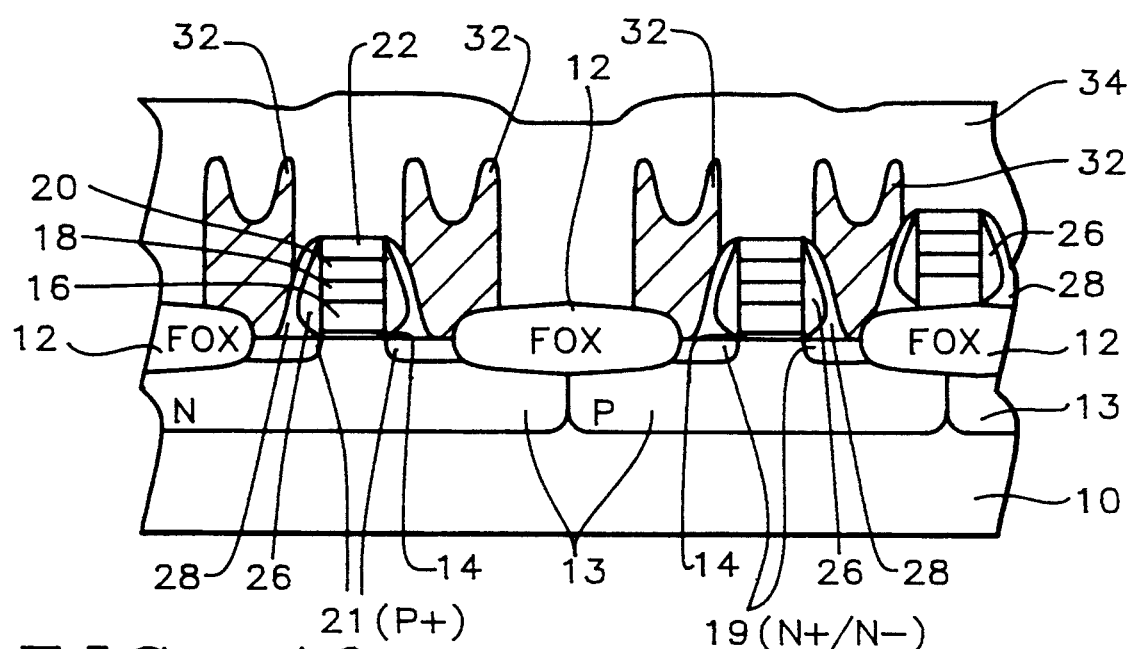

Referring now to FIG. 10, a metal layer 32 is sputter deposited and patterned, followed by the deposition of passivation layer 34. Source/drain regions 19 and 21 are formed as follows. The N— implantation is performed with phosphorus ions at a dosage of between about 5 E 14 to 5 E 15 and an energy of between about 80 to 120 KeV. The N+ implantation is performed with arsenic ions at a dosage of between about 1 E 15 to 1 E 16 atoms/$cm^2$ and an energy of between about 80 to 120 KeV. The ions are driven in by subjecting the wafer to heating at between about 900° to 1100° C. in a nitrogen ambient to form N+/N— source/drain regions 19. P+ source/drain regions are formed by implanting boron ions at a dosage of between about 1 E 14 to 1 E 15 atoms/$cm^2$ and energy of between about 20 to 60 KeV followed by a drivein at between about 900° and 1000° C. to form P+ source/drain regions 21.

Using the nitride cap process of the present invention can result in a metal step coverage improvement of more than 15%. The sidewall nitride overhang and sidewall birds-beak are eliminated so that there are no sensitive contact wet etch concerns, A low selectivity recipe of 1:3 $SiO_2:Si_3N_4$ is used in the nitride etchback process. Other advantages of the process of the invention include less sidewall oxidation, a better channel structure under the polysilicon gate, improving short channel effect, and a wider process window in which to optimize contact resistance. No mask replacement is needed for this process. The TEOS layer 22 protects the capacitor nitride layer 20 from damage during the etchback process. Better performance is achieved in the device leakage area.

The nitride cap process of the invention has a more critical process in the deposition of the TEOS layer and nitride etchback than the prior art process. A larger PMOS voltage threshold dosage is required. A tiny nitride plateau is formed at the corner of the contact. However, these concerns are outweighed by the advantages provided by the process of the invention; most importantly, improved metal step coverage, elimination of sidewall overhang and reduction of sidewall birdsbeak, better channel structure under the polysilicon gate, and a wider process window in which to optimize contact resistance.

While the invention has been particularly shown and described with reference to the preferred embodiments thereof, it will be understood by those skilled in the art that various changes in form and details may be made without departing from the spirit and scope of the invention.

What is claimed is:

1. The method of forming a self-aligned contact to regions within a silicon substrate without lithography comprising:

providing a pattern of polysilicon gate electrode stack including a silicon oxide gate dielectric, a polysilicon gate electrode, a first thermal polyoxide layer over the top of said polysilicon gate electrode layer, a first silicon nitride layer over said first thermal polyoxide layer, and a silicon oxide layer over said silicon nitride layer, wherein each of said layers has its sides open to the ambient;

implanting inert ions into said substrate which is not covered by said polysilicon gate electrode stack in such a manner as to reduce the possibility of the oxidation of the surface of said substrate;

subjecting the said pattern of polysilicon gate electrode stack and said surface of said substrate to a thermal oxidizing ambient which causes oxidation of the said sides open to the ambient of said polysilicon layer to form a second polyoxide layer on the sides of said polysilicon layer;

forming a second silicon nitride layer over said pattern of stack and said surface of said substrate;

anisotropically etching said second silicon nitride layer to remove said second silicon nitride from the top of said stack and from over said surface of said substrate while leaving said second silicon nitride layer remaining upon said sides of said stack to form a self-aligned opening to regions within said silicon substrate; and forming said self-aligning contact to said regions through said opening.

2. The method of claim 1 wherein said silicon oxide layer overlying said silicon nitride layer is composed of tetraethoxysilane (TEOS) deposited to a thickness of between about 300 to 500 Angstroms and wherein said TEOS layer protects said underlying silicon nitride layer from damage during said subsequent etching process.

3. The method of claim 1 wherein said inert ions are $N_2$ ions implanted at a dosage of between about 3 E 15 to 4 E 15 atoms/cm$^2$ at an energy of between about 50 to 60 KeV.

4. The method of claim 1 wherein said thermal oxidizing ambient is at a temperature of between about 900° and 1000° C. and said second polyoxide layer is formed to a thickness of between about 1850 to 2350 Angstroms.

5. The method of claim 1 wherein said second silicon nitride layer is deposited to a thickness of between about 550 to 650 Angstroms.

6. The method of claim 1 wherein said etching of said second silicon nitride layer is performed by a reactive ion etch and wherein the selectivity of said etching process is about 1:3 (silicon oxide:silicon nitride).

7. The method of forming a self-aligned contact to regions within a silicon substrate without lithography comprising:

providing a silicon oxide gate dielectric over the surface of said silicon substrate;

depositing a layer of polysilicon to form a gate electrode over the surface of said silicon oxide gate dielectric;

growing a first thermal polyoxide layer over the top of said polysilicon gate electrode layer;

depositing a first silicon nitride layer over said first thermal polyoxide layer;

depositing a silicon oxide layer over said first silicon nitride layer;

etching said silicon oxide, silicon nitride, polyoxide, polysilicon, and gate dielectric layers to form a pattern of polysilicon gate electrode stacks on the surface of said substrate wherein each of said layers has its sides open to the ambient;

implanting inert ions into said substrate which is not covered by said polysilicon gate electrode stack in such a manner as to reduce the possibility of the oxidation of the surface of said substrate;

subjecting the said pattern of polysilicon gate electrode stack and said surface of said substrate to a thermal oxidizing ambient which causes oxidation of the said sides open to the ambient of said polysilicon layer to form a second polyoxide layer on the sides of said polysilicon layer;

forming a second silicon nitride layer over said pattern of stack and said surface of said substrate;

anisotropically etching said second silicon nitride layer to remove said second silicon nitride from the top of said stack and from over said surface of said substrate while leaving said second silicon nitride layer remaining upon said sides of said stack to form a self-aligned opening to regions within said silicon substrate; and forming said self-aligning contact to said regions through said opening 8. The method of claim 7 wherein said silicon oxide layer overlying said silicon nitride layer is composed of tetraethoxysilane (TEOS) deposited to a thickness of between about 300 to 500 Angstroms and wherein said TEOS layer protects said underlying silicon nitride layer from damage during said subsequent etching process.

9. The method of claim 7 wherein said inert ions are $N_2$ ions implanted at a dosage of between about 3 E 15 to 4 E 15 atoms/cm$^2$ at an energy of between about 50 to 60 KeV.

10. The method of claim 7 wherein said thermal oxidizing ambient is at a temperature of between about 900° and 1000° C. and wherein said second polyoxide layer is formed to a thickness of between about 1850 to 2350 Angstroms.

11. The method of claim 7 wherein said second silicon nitride layer is deposited to a thickness of between about 550 to 650 Angstroms.

12. The method of claim 7 wherein said etching of said second silicon nitride layer is performed by a reactive ion etch and wherein the selectivity of said etching process is about 1:3 (silicon oxide:silicon nitride).

* * * * *